United States Patent [19]
Hong

[11] Patent Number: 5,538,913
[45] Date of Patent: Jul. 23, 1996

[54] PROCESS FOR FABRICATING MOS TRANSISTORS HAVING FULL-OVERLAP LIGHTLY-DOPED DRAIN STRUCTURE

[75] Inventor: Gary Hong, Hsinchu, Taiwan

[73] Assignee: United Microelectronics Corporation, Hsinchu, Taiwan

[21] Appl. No.: 558,958

[22] Filed: Nov. 13, 1995

[51] Int. Cl.⁶ ............................................. H01L 21/265
[52] U.S. Cl. ................... 437/44; 437/29; 437/40; 437/41
[58] Field of Search ................. 437/44, 40 GS, 437/40 SW, 41 RLD, 41 CS, 41 GS, 41 SW, 29, 913

[56] References Cited

U.S. PATENT DOCUMENTS

| | | | |
|---|---|---|---|
| 5,082,794 | 1/1992 | Pfiester et al. | 437/41 CS |
| 5,175,119 | 12/1992 | Matsutani | 437/41 CS |
| 5,374,574 | 12/1994 | Kwon | 437/40 GS |
| 5,374,575 | 12/1994 | Kim et al. | 437/40 GS |
| 5,434,093 | 7/1995 | Chau et al. | 437/44 |
| 5,489,543 | 2/1996 | Hong | 437/44 |

*Primary Examiner*—Trung Dang
*Attorney, Agent, or Firm*—Ladas & Parry

[57] ABSTRACT

A process for fabricating a MOS transistor having a full-overlap lightly-doped drain is disclosed. The MOS transistor is fabricated on a semiconductor silicon substrate that has formed thereon a field oxide layer that defines the active region of the MOS transistor. A field oxide layer is first used as the shielding mask for implanting impurities into the active region thereby forming a lightly-doped region. A shielding layer is then formed with an opening over the surface of the substrate. The opening has two sidewalls that generally define the channel region for the MOS transistor. A gate insulation layer is then formed over the surface of the substrate within the confinement of the opening. Conducting sidewall spacers are then formed over the sidewalls of the opening. The shielding layer and conducting sidewall spacers are then utilized as the shielding mask for implanting impurities into the lightly-doped region, thereby forming the channel region for the MOS transistor. A conducting layer is then formed over the surface of the gate insulation layer in the space as confined within the conducting sidewall spacers, wherein the conducting layer and the conducting sidewall spacers constitute the gate for the MOS transistor. The shielding layer is then removed. The gate and field oxide layer are used as the shielding mask for implanting impurities into the substrate, thereby forming a heavily-doped region, wherein the lightly-doped region completely overlaps the gate, and extends into the drain and source regions of the MOS transistor.

6 Claims, 5 Drawing Sheets

PROCESS FOR FABRICATING MOS TRANSISTORS HAVING FULL-OVERLAP LIGHTLY-DOPED DRAIN STRUCTURE

BACKGROUND OF THE INVENTION

1. Field of the Invention

The present invention relates in general to a process for fabricating semiconductor MOS transistor devices. In particular, the present invention relates to a process for fabricating MOS transistor devices having a full-overlap lightly-doped drain structural configuration. More particularly, the present invention relates to a process for fabricating MOS transistor devices having a full-overlap lightly-doped drain structure that are suitable for semiconductor circuit integration and provide improved operational characteristics.

2. Technical Background

As the semiconductor technology of integrated circuit fabrication advances, the components constituting the electronic circuitry in the IC are becoming ever smaller in their physical dimensions. In semiconductor fabrication processes that employ resolutions in the submicron range, thermal electrons trapped in gates of MOS transistors of an IC device have become a significant factor affecting the operational reliability of the device itself. A brief description of a conventional MOS transistor with a lightly-doped drain, as well as its process of fabrication, is examined below to assist in the understanding of the disclosure of the present invention.

A conventional MOS transistor device having lightly-doped drain (hereafter referred to as LDD MOS transistor), together with the process employed in its fabrication is depicted in FIGS. 1a–1d, which schematically show in cross-sectional views a conventional LDD MOS transistor in selected process stages of its fabrication.

Referring to FIG. 1a, P-type semiconductor substrate 1 has formed at the designated locations two field oxide layers 1a. Gate oxide layer 100 and polysilicon layer 102 are then formed over the surface of substrate 1 providing gate 10 for the MOS transistor to be fabricated.

Then, referring to FIG. 1b, gate 10 and field oxide layers 1a are utilized as the shielding mask for implanting N-type impurities, such as arsenic, into the predetermined depth of P-type substrate 1, thereby forming lightly-doped regions 12.

Then, as is seen in FIG. 1c, sidewall spacers 120 are formed over the sidewalls of gate 10. This is done by, for example, first depositing a layer of nitride, and then performing a plasma etching procedure to remove all other portions of the deposited nitride layer, thereby forming sidewall spacers 120.

Next, referring to FIG. 1d, field oxide layers 1a, sidewall spacers 120, as well as gate 10 are utilized as the shielding mask for implanting the same N-type impurities to form the heavily-doped regions, which in this descriptive prior art example are N-type doped regions 14 as shown in the drawing. A portion of each of lightly-doped regions 12 remains unaffected by the impurity implantation. This allows the formation of drain and source regions for the MOS transistor each having a lightly-doped portion.

However, because MOS transistors are getting ever smaller in their physical dimensions, the transistor channel region located between the drain and source regions is also getting small in dimension as well. This enlarges the relative ratio of the area for the lightly-doped region to that of the transistor channel region. Since the electrical impedance value in the lightly-doped region is larger than that of the heavily-doped regions, the overall operational characteristics of the MOS transistor therefore deteriorate. The phenomena of punch-through in the transistor channel region is more likely to happen, thereby disadvantageously disabling the operation of the MOS transistor.

SUMMARY OF THE INVENTION

It is therefore an object of the present invention to provide a process for fabricating MOS transistor devices with a full-overlap lightly-doped drain having improved channel region punch-through prevention characteristics.

It is another object of the present invention to provide a process for fabricating MOS transistor devices with a full-overlap lightly-doped drain having improved operational characteristics.

The present invention achieves the above-identified objects by providing a process for fabricating a MOS transistor having a full-overlap lightly-doped drain. The MOS transistor is fabricated on a semiconductor silicon substrate that has formed thereon a field oxide layer that defines the active region of the MOS transistor. A field oxide layer is first used as the shielding mask for implanting impurities into the active region thereby forming a lightly-doped region. A shielding layer is then formed with an opening over the surface of the substrate. The opening has two sidewalls that generally define the channel region for the MOS transistor. A gate insulation layer is then formed over the surface of the substrate within the confinement of the opening. Conducting sidewall spacers are then formed over the sidewalls of the opening. The shielding layer and conducting sidewall spacers are then utilized as the shielding mask for implanting impurities into the lightly-doped region, thereby forming the channel region for the MOS transistor. A conducting layer is then formed over the surface of the gate insulation layer in the space as confined within the conducting sidewall spacers, wherein the conducting layer and the conducting sidewall spacers constitute the gate for the MOS transistor. The shielding layer is then removed. The gate and field oxide layer are used as the shielding mask for implanting impurities into the substrate, thereby forming a heavily-doped region, wherein the lightly-doped region overlaps the gate and extends into the drain and source regions of the MOS transistor.

Other objects, features, and advantages of the present invention will become apparent by way of the following detailed description of the preferred but non-limiting embodiments.

BRIEF DESCRIPTION OF THE DRAWING

The detailed description of a preferred embodiment is made with reference to the accompanying drawings in which.

DETAILED DESCRIPTION OF THE PREFERRED EMBODIMENT

For a detailed description of the present invention, a preferred embodiment of the process for fabricating the MOS transistor devices with a full-overlap lightly-doped drain is described below. FIGS. 2a–2e show in cross-sectional views the MOS transistor with full-overlap lightly-doped drain of an IC device as depicted at selected process stages of its fabrication. The MOS transistor device of the present invention is fabricated on semiconductor substrate 20 of a first type, which may be either an N- or P-type substrate, although in the exemplified embodiment, a P-type substrate is utilized. The substrate of the first type has formed thereon field oxide layers 200 for defining active region 202 of the MOS transistor to be fabricated.

Specifically, a thermal oxidation procedure is employed to grow a layer of pad oxide 210 over the surface of semiconductor substrate 20. Then, a deposition procedure is utilized to deposit a nitride layer (not shown in FIG. 2a), which is subsequently subjected to a photolithography procedure to define active region 202 by etching in the nitride layer. Then, a thermal oxidation procedure is performed to grow field oxide layers 200. The nitride layer is then removed. The process for the fabrication of the MOS transistor device in accordance with the disclosure of the present invention is described as follows.

Stage 1

Figure 1A:
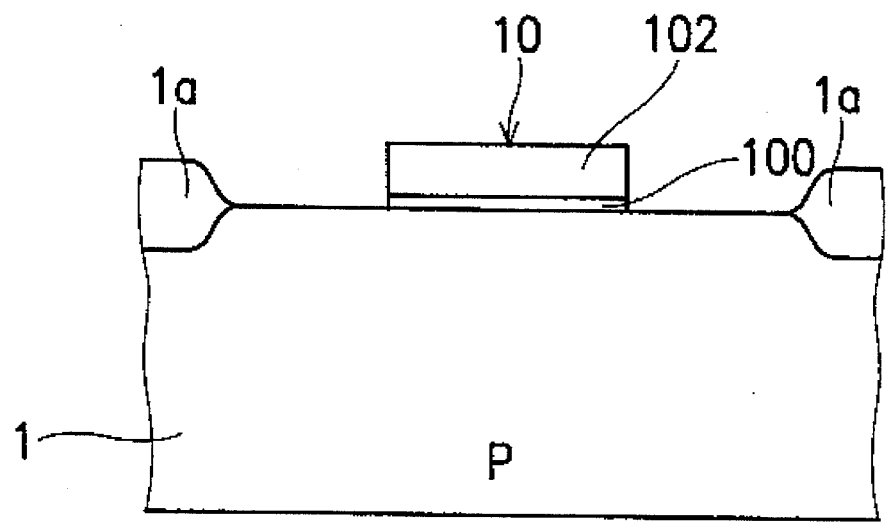
FIGS. 1a–1d schematically show cross-sectional views of the conventional MOS transistor with lightly-doped drain of an IC device as depicted at selected process stages of its fabrication.
Figure 1B:
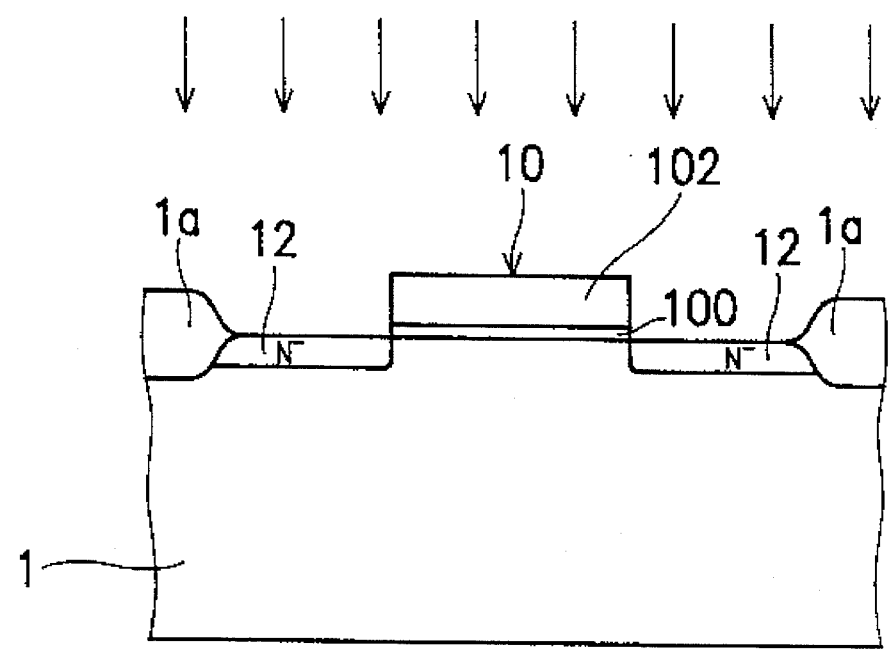
Figure 1C:
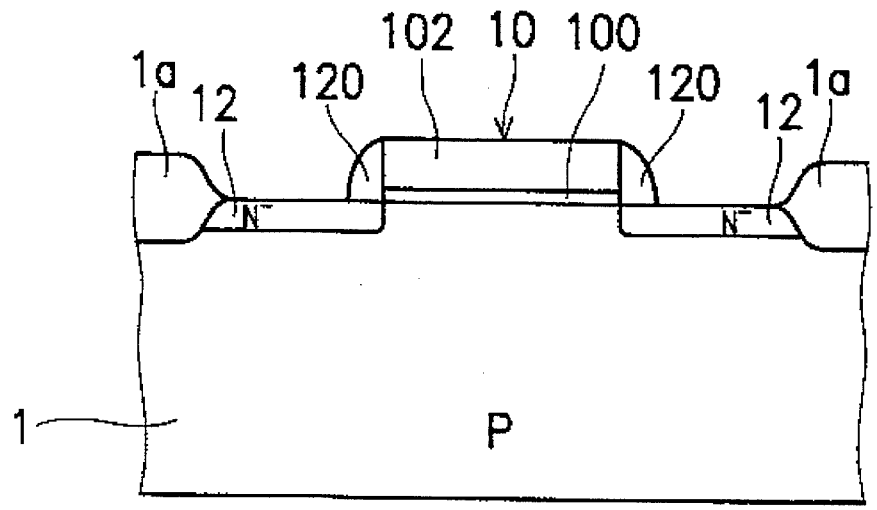
Figure 1D:
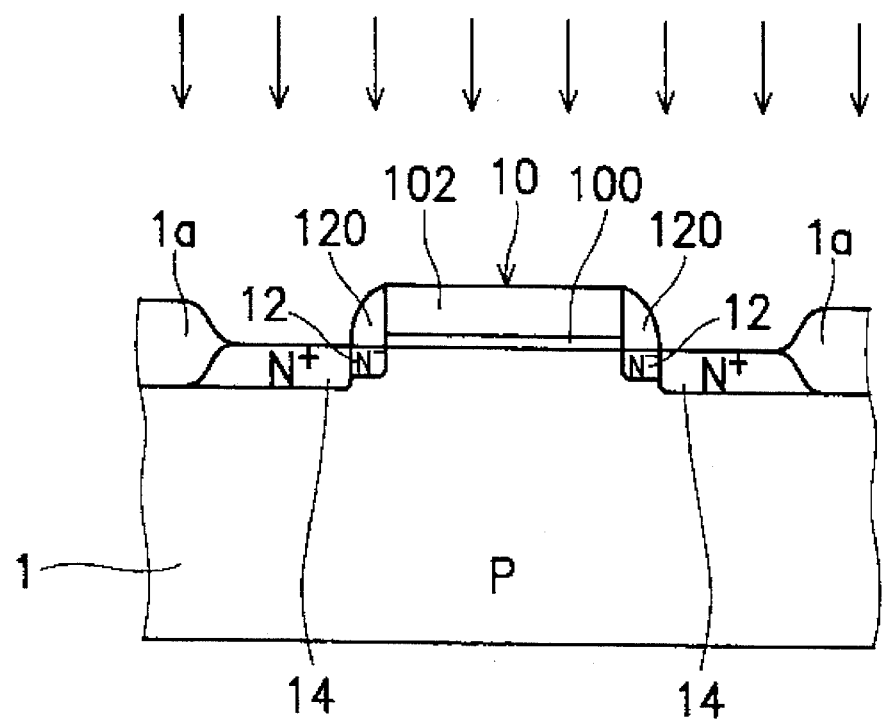
Figure 2A:
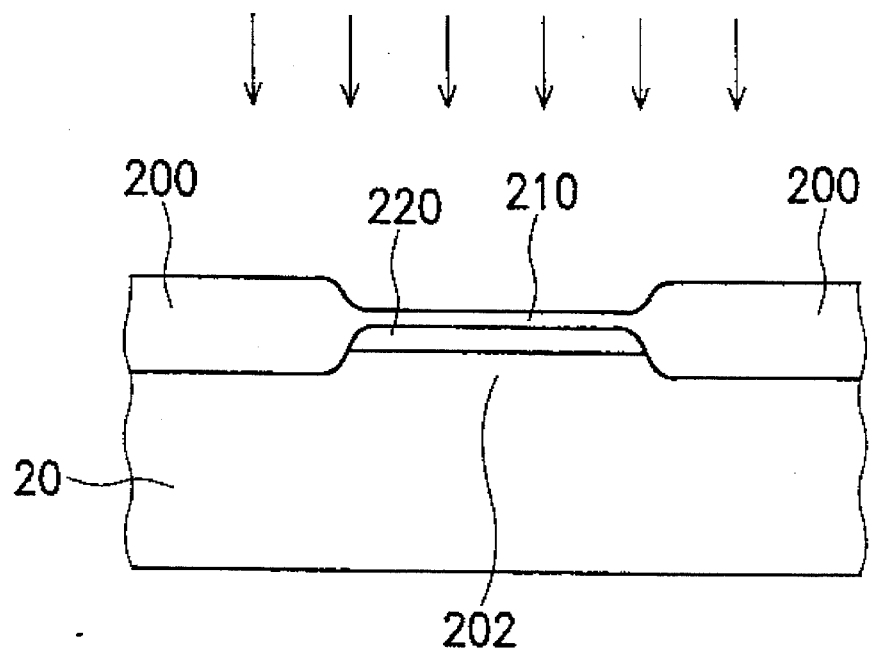
FIGS. 2a–2e schematically show cross-sectional views of the MOS transistor with a full-overlap lightly-doped drain of an IC device as depicted at selected process stages of its fabrication in accordance with a preferred embodiment of the present invention.

Referring to FIG. 2a, field oxide layers 200 are utilized as the shielding mask for implanting impurities of the second type into active region 202 as defined in semiconductor substrate 20, thereby forming lightly-doped region 220 of the second type. This can be done by, for example, implanting phosphorus (P) ions into semiconductor substrate 20 with an implanting-energy of about 60 keV, that achieves a dosage of, for example, about $2 \times 10^{13}$ atoms/cm$^2$.

Stage 2

Figure 2B:
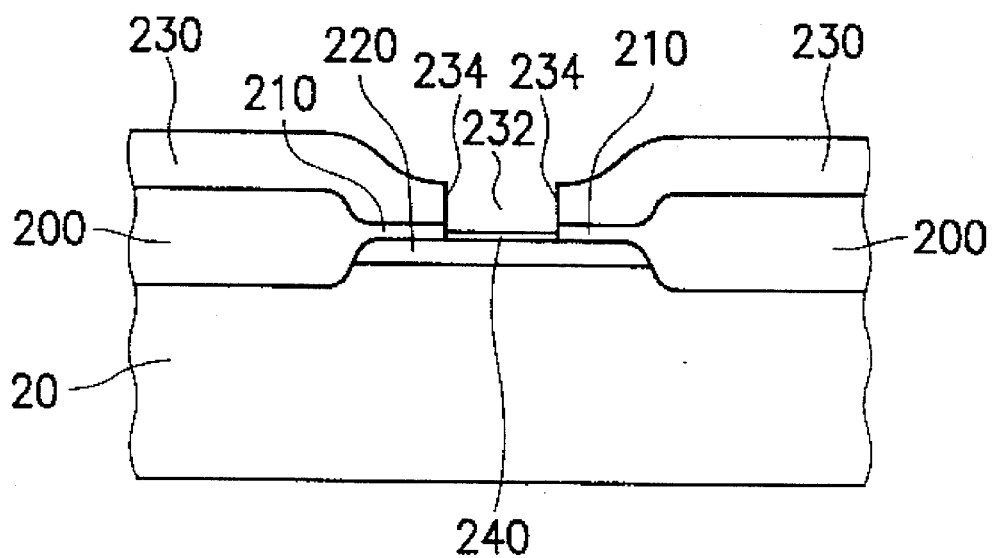

Then, referring to FIG. 2b, during this stage, shielding layer 230 is formed over the surface of semiconductor substrate 20. Shielding layer 230 has opening 232 located generally at the center of the layer. Opening 232 has two sidewalls 234 for generally defining a channel region for the transistor being fabricated. Insulation layer 240 is then formed over the surface of semiconductor substrate 20 within the confinement of opening 232 which serves the function of the gate insulator for the transistor. This can be achieved by, for example, depositing nitride layer 230 in a chemical vapor deposition (CVD) process to a thickness of about 1,000–4,000Å. A photolithography procedure then follows to etch the designated portion of nitride layer 230 and further into pad oxide layer 210 below, thereby forming opening 232 with sidewalls 234 formed at the edges of nitride layer 230. A thermal oxidation procedure then grows gate oxide layer 240 in the exposed surface of semiconductor substrate 20 within the opening 232.

Stage 3

Figure 2C:
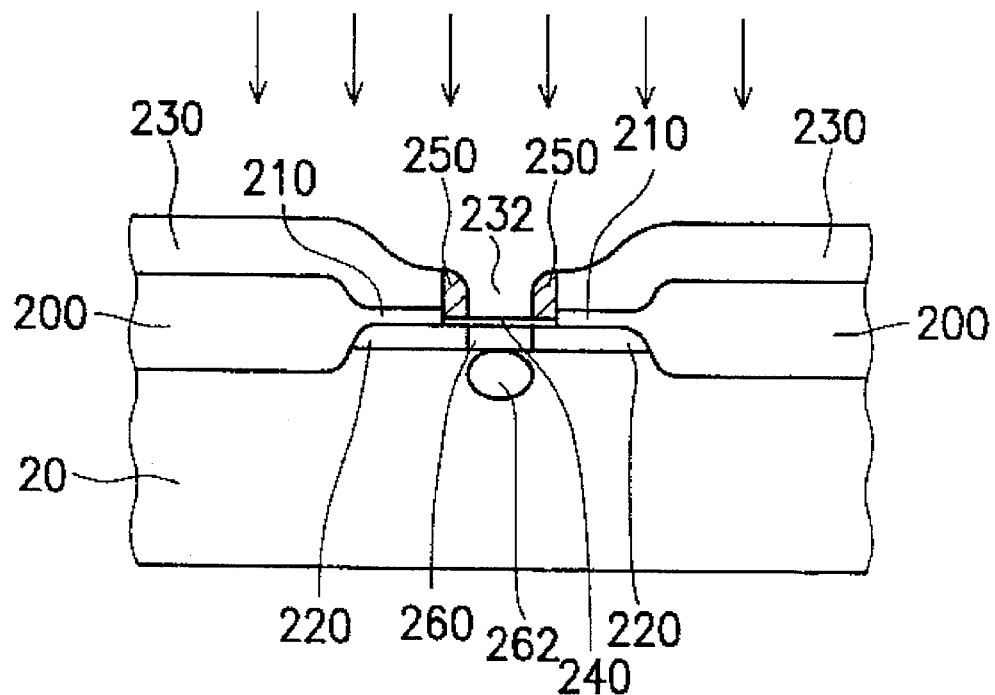

Next, in FIG. 2c, conducting sidewall spacers 250 are then formed on sidewalls 234 of the opening 232. Shielding layer 230 and conducting sidewall spacers 250 are then utilized as the shielding mask for performing an ion implantation procedure. Impurities of the first type are implanted into lightly-doped region 220 of the second type, forming channel region 260 of the first type for the MOS transistor being fabricated. This is achieved by, for example, first depositing a polysilicon layer to a thickness of about 500–2,000Å, and then performing an etching-back procedure to form conducting sidewall spacers 250. Boron (B), or BF2 ions are then implanted into lightly-doped region 220 of the second type. Boron ions are, for example, implanted with an implanting energy level of about 30 keV, achieving a dosage of about $2-3 \times 10^-$ atoms/cm$^2$. In the case of BF$_2$, the implanting energy level is about 50 keV, also with an achieved dosage of about $2-3 \times 10 \times 10^{13}$ atoms/cm$^2$. The result of the ion implantation procedure is the formation of P-type channel region 260. A further boron implantation procedure may be conducted at an implanting energy level of about 120 keV targeting for an impurity concentration of $1 \times 10^{12}$ atoms/cm$^2$. This additional ion implantation procedure forms P-type diffusion region 262, which serves to prevent punch-through of the channel region.

Stage 4

Figure 2D:
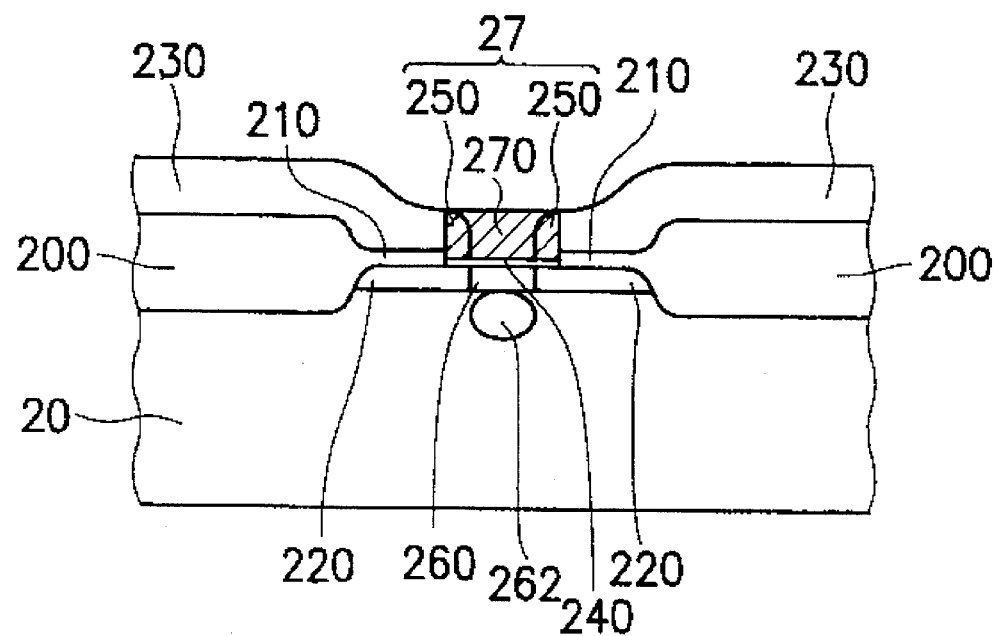

Referring next to FIG. 2d, conducting layer 270 is then formed over the surface of gate insulation layer 240 as formed inside the space confined by the two conducting sidewall spacers 250. Conducting layer 270, together with conducting sidewall spacers 250, constitute gate electrode 27 for the MOS transistor being fabricated. This can be done by, for example, first depositing a polysilicon layer that fills the space confined inside conducting sidewall spacers 250. Then, impurities are implanted into the deposited polysilicon layer to reduce the electrical impedance thereof. An etching-back, or alternatively, a chemical-mechanical polishing (CMP) procedure may then be employed to remove the portion of the deposited polysilicon layer that rises above the surface of shielding layer 230. This forms conducting layer 270 as shown in FIG. 2d.

Stage 5

Figure 2E:
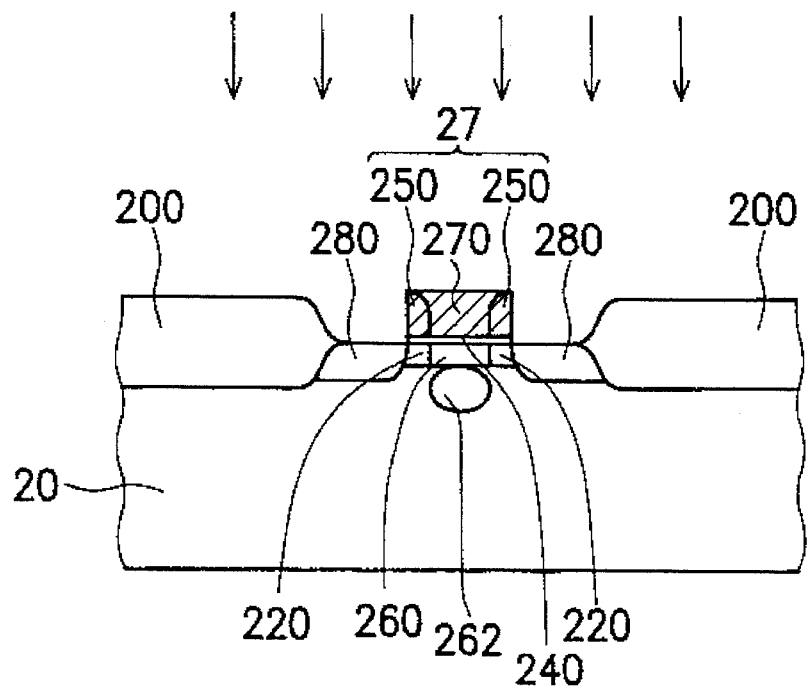

Finally, as shown in FIG. 2e, shielding layer 230 is removed. Field oxide layer 200 and gate 27 are then utilized as a shielding mask for the implementation of an ion implantation procedure. Impurities of the second type are implanted into semiconductor substrate 20, thereby forming heavily-doped region 280 of the second type, i.e. source and drain region of the MOS transistor. The control of the ion implantation conditions allows lightly-doped region 220 of the second type to extend into the drain and source regions of the MOS transistor being fabricated. This is done by, for example, conducting the implantation of arsenic (As) ions at an implanting energy level of about 50 keV, achieving an impurity concentration of about $4 \times 10^{15}$ atoms/cm$^2$. This allows the formation of N$^+$-type doped region 280 as shown in the drawing.

Figure 3A:
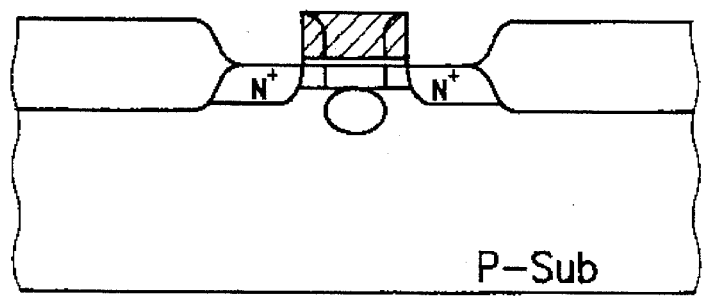
FIGS. 3a and 3b schematically show cross-sectional views of the MOS transistors with full-overlap lightly-doped drains fabricated on silicon substrates of various conductivity types.
Figure 3B:
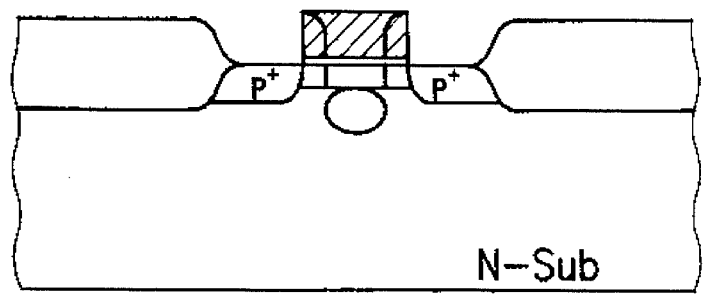

Thus, the above-described process stages generally concludes the process of fabricating N-type LDD MOS transistors as well as P-type transistors, as depicted in FIG. 3a and 3b, respectively. Because the conducting sidewall spacers of the gate electrode of the transistors are located above the lightly-doped region, and in fact totally overlapping the lightly-doped region of the transistor device, several advantageous characteristics are noticeable.

First of all, when the LDD MOS transistor of the present invention is switched into its conduction state, the conducting sidewall spacers tend to attract electric charges to the lightly-doped region therebeneath. This helps to reduce the electrical impedance characteristics of the lightly-doped region. This is particularly desirable for miniaturized MOS transistors in that the operational characteristics of the transistor may be improved. Also, the overlapping helps prevent transistor channel region punch-through, thereby sustaining normal operating conditions for the fabricated LDD MOS transistor.

What is claimed is:

1. A process for fabricating a MOS transistor having a full-overlap lightly-doped drain on a semiconductor substrate of a first conductivity type, said semiconductor substrate having formed thereon a field oxide layer defining an active region of said MOS transistor, said process comprising the steps of:

implanting impurities of a second conductivity type into said active region on said semiconductor substrate using said field oxide layer as a first shielding mask to form a lightly-doped region;

forming a shielding layer over said semiconductor substrate having an opening, said opening having two sidewalls generally defining a channel region for said MOS transistor;

forming a gate insulation layer over a surface of said semiconductor substrate within said opening;

forming conducting sidewall spacers over said sidewalls of said opening;

implanting impurities of the first conductivity type into said lightly-doped region transistor using said shielding layer and said conducting sidewall spacers as a second shielding mask to form a channel region for said MOS;

forming a conducting layer over said gate insulation layer between said conducting sidewall spacers, said conducting layer and said conducting sidewall spacers constituting a gate for said MOS transistor;

removing said shielding layer; and implanting impurities of the second conductivity type into said semiconductor substrate using said gate and said field oxide layer as a third shielding mask to form a heavily-doped region.

2. The process of claim 1, wherein the step of implanting impurities of the first conductivity type into said lightly-doped region to form a channel region includes the step of implanting impurities of the first conductivity type into said semiconductor substrate to form a diffusion region below said channel region for preventing punch-through of said channel region.

3. The process of claim 1, wherein said shielding layer is a nitride layer and said gate insulation layer is an oxide layer.

4. The process of claim 1, wherein said conducting layer and said conducting sidewall spacers are polysilicon.

5. The process of claim 1, wherein said first conductivity type is P-type and said second conductivity type is N-type.

6. The process of claim 1, wherein said first conductivity type is N-type and said second conductivity type is P-type.

* * * * *